United States Patent
Jahromi et al.

(10) Patent No.: US 8,475,897 B2
(45) Date of Patent: Jul. 2, 2013

(54) LAMINATE AND COMPOSITE LAYER COMPRISING A SUBSTRATE AND A COATING, AND A PROCESS AND APPARATUS FOR PREPARATION THEREOF

(75) Inventors: Shahab Jahromi, Maastricht (NL); Gerardus Johannes Paulus Krosshof, Sittard (NL); Alexandra Lorena Quiceno Gomez, Cartagena (CO); Gerd Hoffmann, Bruchkoebel (DE)

(73) Assignees: DSM IP Assets B.V., Heerlen (NL); Biofilm S.A., Cartagena (CO); Applied Materials GmbH & Co. KG, Alzenau (DE)

( * ) Notice: Subject to any disclaimer, the term of this patent is extended or adjusted under 35 U.S.C. 154(b) by 0 days.

(21) Appl. No.: 12/669,306

(22) PCT Filed: Jul. 7, 2008

(86) PCT No.: PCT/EP2008/005514
§ 371 (c)(1),
(2), (4) Date: Nov. 12, 2010

(87) PCT Pub. No.: WO2009/012878
PCT Pub. Date: Jan. 29, 2009

(65) Prior Publication Data
US 2011/0045258 A1   Feb. 24, 2011

(30) Foreign Application Priority Data
Jul. 20, 2007 (EP) .................................. 07014273

(51) Int. Cl.
B32B 27/32 (2006.01)
B32B 27/34 (2006.01)

(52) U.S. Cl.
USPC ......... 428/36.6; 428/36.7; 428/385; 428/387; 428/423.7; 428/425.5

(58) Field of Classification Search
USPC .............. 428/213, 215, 216, 336, 387, 423.5, 428/423, 7, 36.6, 36.7, 385, 423.7, 425.5
See application file for complete search history.

(56) References Cited

U.S. PATENT DOCUMENTS

| | | | | |
|---|---|---|---|---|
| 3,442,686 A | * | 5/1969 | Jones | 428/336 |
| 4,619,735 A | * | 10/1986 | Norton | 162/135 |
| 5,942,320 A | * | 8/1999 | Miyake et al. | 428/216 |
| 6,296,895 B1 | * | 10/2001 | Steiniger et al. | 427/10 |
| 6,632,519 B1 | * | 10/2003 | Jahromi et al. | 428/335 |
| 6,893,679 B2 | * | 5/2005 | Jahromi et al. | 427/248.1 |
| 7,794,786 B2 | * | 9/2010 | Jahromi | 427/248.1 |
| 7,998,527 B2 | * | 8/2011 | Jahromi | 427/248.1 |

FOREIGN PATENT DOCUMENTS

| | | |
|---|---|---|
| DE | 199 17 076 | 10/2000 |
| DE | 19917176 | * 10/2000 |
| WO | 2004/101843 | 11/2004 |

OTHER PUBLICATIONS

International Search Report for PCT/EP2008/005514, mailed Oct. 13, 2008.
Written Opinion of the International Searching Authority for PCT/EP2008/005514, mailed Oct. 13, 2008.

* cited by examiner

*Primary Examiner* — Cathy Lam
(74) *Attorney, Agent, or Firm* — Nixon & Vanderhye P.C.

(57) ABSTRACT

The invention relates to a laminate comprising two plastic films and in between a metal or metaloxide layer and a crystalline triazine layer, the laminate having a lamination strength of about 2 N/inch or more as measured in a 90 degree tensile testing at 30 mm/min. The invention further relates to a composite layer, comprising a metal or metal oxide, and a triazine layer comprising a triazine compound suitable for said laminate. The invention further relates to a process for the preparation of a composite layer, comprising the step of applying a triazine layer on a substrate with a metal or metal oxide layer by vapor deposition of the triazine compound, wherein the process comprises (a) applying to the metal or metal oxide layer a compound other than a triazine compound, (b) vapor depositing the triazine compound on the metal or metal oxide layer while the compound is at least in part in a liquid state.

18 Claims, 1 Drawing Sheet

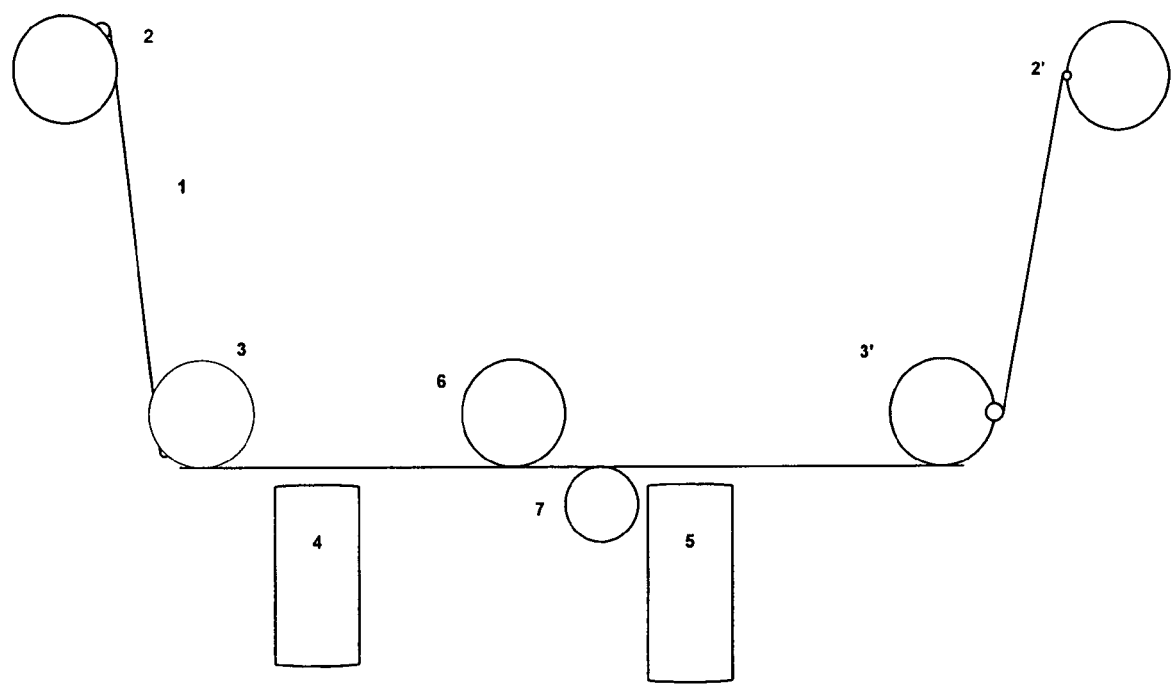

LAMINATE AND COMPOSITE LAYER COMPRISING A SUBSTRATE AND A COATING, AND A PROCESS AND APPARATUS FOR PREPARATION THEREOF

This application is the U.S. national phase of International Application No. PCT/EP2008/005514, filed 7 Jul. 2008, which designated the U.S. and claims priority to European Application No. 07014273.2, filed 20 Jul. 2007, the entire contents of each of which are hereby incorporated by reference.

The invention relates to a laminate comprising two plastic films with good barrier and adhesion properties. The invention further relates to a composite layer comprising a substrate, a metal or metal oxide and a coating, a process and an apparatus for the preparation thereof.

Laminates are used in the packaging, electronic and other industries. Often, the laminates need good barrier properties like low oxygen or water vapor transmission rates. Plastic or paper films need to be coated with one or more layers improving the barrier properties. Yet, the adhesion between the films need to be sufficiently high. Substrates, for example polyolefin or polyester films coated with a metal or metal oxide, like e.g. aluminium, aluminium oxide, magnesium oxide or silicium oxide are known. These films are likewise used in the packaging or electronic industry. Such films can have good barrier properties, however the metal or metal oxide layers that are used to enhance barrier properties are easily damaged. Hence, the metal or metal oxide layer is protected with a further coating. Such coating is often applied off line in a separate process step. The composite layer so obtained is further laminated with e.g. a further polyolefin film while using an adhesive.

Object of the invention is to provide a laminate comprising a substrate, a metal or metal oxide barrier layer with a protective layer having good barrier properties and a good lamination strength.

Another object of the invention is to provide a composite layer comprising a substrate, a metal or metal oxide barrier layer with a protective layer that can be applied in line.

The invention provides a laminate comprising a substrate and a plastic film and in between a metal or metal oxide layer and a crystalline triazine layer, the laminate having a lamination strength of about 2 N/inch or more as measured in a 90 degree tensile testing at 30 mm/min.

Such laminate has outstanding barrier and durability properties.

The invention furthermore provides a composite layer comprising a substrate-layer, a metal or metal oxide barrier layer and a crystalline triazine layer, the composite layer, when laminated on the crystalline triazine layer-side with an adhesive and a plastic film being able to exhibit a lamination strength of about 2 N/inch or more as measured in 90 degree tensile testing at 30 mm/min.

In one embodiment of the invention, the laminate comprises a substrate and a plastic film, and in between these two layers, a metal or metal oxide barrier layer and a crystalline triazine layer.

In a further embodiment of the present invention, the laminate comprises a substrate and a plastic film and in between these layers a metal or metal oxide layer being directly bonded to the substrate or the plastic film.

In a further embodiment of the present invention, the laminate comprises a metal or metal oxide layer directly attached to a plastic layer, and a crystalline triazine layer bonded to the metal or metal oxide layer.

In a further embodiment of the present invention, the laminate comprises an adhesive layer between the crystalline triazine layer a plastic film.

In a further embodiment, the laminate comprises a pattern or FIGURE on the crystalline triazine layer.

In a further embodiment, a film is directly extruded on the crystalline triazine layer, which may be printed.

The crystalline triazine layer protects the metal or metal oxide layer that is provided on the substrate layer.

Furthermore the crystalline triazine layer improves the barrier properties. One the one hand, the crystalline triazine layer has barrier properties as such. On the other hand, if during printing the triazine layer would be slightly damaged, at least the barrier properties of the metal or metal oxide layer remain on a high level, and are largely unchanged. Hence, the crystalline triazine layer helps to protect the metal or metal-oxide layer against the impact of both soft roll and hard roll printing processes which are used to print films.

Furthermore, the crystalline triazine layer protects the metal (in particular alumina) layer against de-activation. Unprotected alumina layers need plasma treatment after some month of storage, in case a converter wants to make a laminate. It appears that the melamine layer overcomes the necessity to perform a plasma treatment, thereby saving money, and speeding-up the lamination process.

Very useful composite layers can be obtained by a substrate that is provided with a barrier layer and a protective layer, which protective layer can be made in one process sequence (after the step where the metal or metal oxide is applied and without rewinding the film), and, the protective layer further can improve the barrier properties. It is however possible to apply the crystalline triazine layer in a separate process step if chosen. It is preferred to apply this protective triazine layer in line because the metal or metal oxide layer can be contaminated or damaged even during rewinding.

The thickness of the crystalline triazine layer as formed on the substrate in the vapour-depositing step depends on its intended purpose, and can thus vary within wide limits. Preferably, the thickness of the layer is about 5 µm or less, and even more preferably about 1 µm or less as with such lower thickness the transparency is improved. The thickness may be for example about 500 nm or less for cost reasons. The minimum thickness is preferably about 2 nm or more, more preferably about 10 nm or more, and even more preferred about 100 nm or more as such thickness improves the protective properties. For example, the thickness can be about 200 or 300 nm or more.

The triazine is in a crystalline state, and generally, grains will be visible if analysed under a SEM. Generally, the grain size will be about 3 nm or more, preferably 10 nm or more. Generally, the grain size will be about 1000 nm or less, preferably 500 nm or less. The void space between the grains generally will be small. In case the triazine layer main purpose is to protect the metal or metal-oxide layer, the void space may be about 5% or less. Preferably, the voice space is about 2% or less, and most preferable, no void space is visible in a SEM.

The crystalline triazine layer may be a top layer, it is however also possible that on top of the layer further layers are present, for example further layers of metal or metal oxide, further layer of triazine, printing or a polymer layer (laminating film).

The crystalline triazine layer according to the invention may comprise in principle, any triazine compound, for example melamine, melam, melem, or melon. Preferably, the triazine compound is melamine.

Preferably the composite layer, when laminated at the side of the crystalline triazine layer with an adhesive and a plastic film is able to exhibit a lamination strength of about 2.5 N/inch or more, more preferably of about 3 N/inch or more, even more preferably of about 3.5 N/inch or more as measured with a tensile testing apparatus at 30 mm/min and at 90 degree. Generally, the upper limit of the lamination strength is not critical, but generally, this will be about 20 N/inch or less. The lamination of the composite layer for testing preferably is done with an appropriate urethane adhesive and laminated with a 10 µm thin polyethylene film. Thereafter, the lamination strength of the two films can be measured, and the failure mode can be observed. An appropriate adhesive is an adhesive that has such adhesion strength that the failure mode is not observed on the adhesion layer below 3.5 N/inch. The adhesion may be so high that the plastic film breaks. The value of the force necessary to break a film can in that case be taken as value for adhesion.

The substrate preferably has a vapour-deposited layer of a metal or metal oxide. Suitable metals and oxides include but are not limited to aluminium, copper, gold, silver, iron, magnesium, silicium or titanium. Preferred examples include aluminium, aluminium oxide, magnesium oxide or silicon oxide.

The metal or metal oxide generally is applied on the substrate by vapour deposition or sputtering. This process is generally performed under vacuum. The metal or metal oxide layer generally has a thickness of about 1 nm or more, preferably about 3 nm or more. Generally, the thickness will be about 100 µm or less, preferably about 40 µm or less. Adhesion of the metal or metal layer to the substrate preferably is sufficiently strong to withstand tearing apart at 2 or 3 N/inch force. Adhesion may be dependent on the substrate, and for example for polyolefin films adhesion can be improved, in comparison with untreated substrates. Preferred methods to improve adhesion strength of the metal or metal oxide layer to a plastic layer includes plasma, corona, UV radiation or electron beam treatment of the substrate.

The substrate comprises a material that serves as carrier, and this generally will be a plastic or paper in the form of a film or shape.

Generally, packaging materials are divided in flexible packaging and rigid packaging. Flexible packaging materials generally are based on film or sheet like materials, hereinafter named film. Rigid packaging generally has a certain shape (three dimensional form).

The composite layer according the invention, in particular the ones with a film as substrate may be used as such, but can also be applied on plastic, paper, cardboard, metal, in any shape or as an article, such as for example PET bottles.

In the case of rigid packaging, the substrate may be a plastic material, cardboard or paper material. Suitable examples of rigid packaging include bottles or pre-shaped packing boxes. Preferred examples of articles are articles made from PET or PP.

In one embodiment of the invention, the layer is part of a packing for food and drink products. Most preferred packaging products include a packing comprising coffee beans or milled coffee beans or a packing comprising beer.

In another embodiment of the invention, the laminate or composite layer is used in or on displays or other electronic products, preferably flexible electronics products. One example of an electronic flexible product is a flexible display.

The film may consist of a homogeneous material, or it may itself be non-homogeneous or a composite material. The film may comprise various layers. Preferably, the film comprises a polymeric material. Examples of polymeric compounds are thermoplastic compounds and thermosetting compounds. Suitable examples of thermoplastic compounds include polyolefins, polyolefin-copolymers, polyvinylalcohol, polystyrenes, polyesters and polyamides. Suitable examples of such polymers include HD or LD polyethlylene (PE), LLD polyethylene, ethylene-propylene copolymers, ethylene-vinylacetate copolymer, polyproplylene (PP) and polyethylene terephtalate (PET). These thermoplastic compounds are often used in the form of a film, either as such or oriented; such orientation may be biaxial, such as for example biaxially oriented polypropylene film (BOPP). The film may also comprise a layer of paper.

The composite layer according the invention has favorable barrier properties, for example a low oxygen transmission rate (OTR) and a low water vapor transmission rate (WVTR), and is sufficient wear resistant. Therefore, the composite layer of the invention can be used as such in printing and laminating.

The OTR is generally measured in an atmosphere of 30° C. and 70% RH. The preferred values generally depends on the substrate. In case the substrate is biaxially oriented polypropylene (BOPP), the OTR generally will be about 40 cc/m$^2$·24 h·MPa or less, preferably about 30 cc/m$^2$·24 h·MPa or less and even more preferred about 20 cc/m$^2$·24 h·MPa or less. Generally, in case of BOPP, the OTR will be about 2 cc/m$^2$·24 h·MPa or higher, and for example may be about 5 cc/m$^2$·24 h·MPa or higher. The OTR can be measured with suitable apparatus, such as for example with an OXTRAN 2/20 manufactured by Modern Control Co. In case the substrate is a PET film, the OTR generally will be about 15 cc/m$^2$·24 h·MPa or less, preferably about 10 cc/m$^2$·24 h·MPa or less and even more preferred about 5 cc/m$^2$·24 h·MPa or less. Generally, in case of BOPP, the OTR will be about 0.5 cc/m$^2$·24 h·MPa or higher, and for example may be about 1 or 2 cc/m$^2$·24 h·MPa or higher Water vapor permeability (WVTR) can measured with a PERMATRAN 3/31 manufactured by Modern Control Co, in an atmosphere of 40° C. and 90% RH. The preferred values will depend on the substrate. For example for BOPP the WVTR is generally about 3 g/m$^2$·24 h or less, preferably about 2 g/m$^2$·24 h or less, and more preferably about 1 g/m$^2$·24 h or less. Generally, the vapor permeability will be about 0.1 g/m$^2$·24 h or more, for example about 0.2 g/m$^2$·24 h or more. For example for PET, the WVTR is generally about 8 g/m$^2$·24 h or less, preferably about 7 g/m$^2$·24 h or less, and more preferably about 4 g/m$^2$·24 h or less. Generally, the vapor permeability will be about 0.5 g/m$^2$·24 h or more, for example about 2 g/m$^2$·24 h or more.

Preferably, the laminate has an OTR and WVTR also for other substrates which conforms to the values given in the former two paragraphs.

The composite layer, optionally further processed by for example printing and laminating, can be applied as or to all kind of packing materials, for example bottles, paper, sheet and films. The packing material protects very well its content from for example oxygen, in this way increasing shelf life of food products or protecting electronic components from oxygen attack.

In one embodiment, the laminate comprises a PET or BOPP film as substrate, a metal or metal oxide layer on said substrate as barrier layer, a crystalline triazine layer as protective and barrier layer on the metal layer, which triazine layer has a pattern or FIGURE, the laminate further comprising on the crystalline triazine layer a pattern or FIGURE and an adhesive and thereon a further film, which may be a polyolefin film, such as preferably a PE film.

The invention also relates to a process for applying a triazine layer according to the invention on a substrate with a metal or metal oxide layer by vapour deposition of a triazine compound comprising the steps of
a) applying to the metal or metal oxide layer a further compound other than a triazine compound, and
b) vapour depositing the triazine compound on the metal or metal oxide layer while the further compound is at least in part in a liquid state.

In-line coating of a substrate with a metal or metal oxide layer with a triazine compound without specific measures did not yield a composite layer with sufficient adhesion if laminated. It appears that a failure is observed at the triazine—metal or metal oxide boundary. Due to this failure mode the metal or metal oxide layer is not sufficiently protected, and therefore may be damaged during further processing, causing for instance the barrier properties to decrease. Also, since most packaging films are in the form of laminate structures, this failure mode leads to poor lamination strength.

A triazine comprising layer and a process for making such layer is described in WO2004/101662. In WO2004/101662 a process is described wherein in a vapor deposition step a triazine compound, preferably melamine, is deposited on a substrate, at reduced pressure, the temperature of the substrate being below the temperature of the vaporized triazine. WO2004/101662 suggests that prior to or during the vapour-depositing step, the substrate may be treated with plasma, corona, UV radiation, electron beam, or a reactive gas such as water or formaldehyde in order to create reactive groups on the surface of the substrate, and thereby improve the adhesion of the layer to the substrate. No experimental evidence is provided.

In the Japanese patent application with publication nr. 2002-19011 treatment of the layer comprising the triazine compound with a polymerising agent is disclosed. Purpose of the treatment is to improve the water resistance of the layer. The compounds suggested to be effective are relatively high molecular weight solids, and comprise isocyanate groups or acid-anhydride groups.

In one embodiment of the invention, the triazine compound in the layer is for at least 80% crystallized, as measured by x-ray diffraction. Preferably the triazine compound in the layer is for about 90% or more, even more preferably for about 95% or more, most preferably for about 98% or more crystallized.

In one embodiment of the present invention, the compound is a polar compound.

The further compound preferably has a dielectric constant of about 2 or higher. The dielectric constant is defined as the actual permittivity to the permittivity of vacuum; it is a dimensionless number.

The dielectric constant of the further compound generally will be about 1 or higher. In case the compound is a polar compound, the dielectric constant is preferably about 2 or higher and more preferably about 4 or higher. Preferably, the dielectric constant of the compound is about 100 or lower, more preferably, about 60 or lower. Examples of suitable further compounds include, but are not limited to methanol (33), acetic acid (6.2), propanal (18.5), ethanol (25.3), acetone (21), butylacetate (5), cyclohexane, toluene and decane. (dielectric constant in brackets)

The polar compound preferably comprises oxygen or nitrogen atoms as heteroatoms. Suitable examples of polar groups include aldehyde, alcohol, ether, ketone, ester or carboxylic acid groups. Preferably, the polar compound comprises alcohol, ether or ketone groups. Suitable examples of polar compounds include, but are not limited to, methanol, ethanol, iso-propanol, 1-propanol, dimethylsulfoxide, 1-pentanol, 1-butanol, acetone, methyl-ethyl-ketone, acetic acid, ethanal, propanal, n-butylacetate, i-propyl acetate, ethylacetate, ethylformiate and water, or formaldehyde in water, and mixtures thereof. However, water or water-formaldehyde solutions are less preferred. Examples of mixtures include, but are not limited to mixtures of the several alcohols, mixtures of alcohols with water, and mixtures of esters.

Some of the polar compounds have functional groups which are theoretically able to react with melamine, or another triazine. However, the inventors have found no evidence for any reaction at detection limits of for example XPS/ESCA, NMR, RAMAN and IR.

Preferred further compounds in the process of the present invention include methanol, ethanol, isopropanol, butylacetate, propylacetate and acetone. Generally, these compounds are not expected to react with a triazine at the processing conditions.

The present invention preferably uses a further compound that does not react with the triazine compound. Alternatively, the process conditions are chosen such that the substrate is contacted at a temperature low enough and/or during a time interval short enough that substantially no reaction takes place between the compound at one hand and the substrate and/or the triazine compound at the other hand.

In one embodiment, the further compounds used according the present invention form a liquid layer, which will evaporate shortly after forming the triazine layer. The molecular weight of the polar compound will be about 150 dalton or lower, preferably about 100 dalton or lower.

In one embodiment of the invention, it is preferred to chose compounds having a vapour pressure of below 100 kPa (at 25° C.). The vapour pressure will be in general about 0.01 kPa or higher, preferably about 1 kPa or higher. Preferably, the vapour pressure is about 80 or lower, more preferably about 50 or lower. Examples of suitable compounds include, but are not limited to, methanol (16.9), acetic acid (2.1), propanal (42), ethanol (7.9), acetone (30.8), butylacetate (1.7). (vapour pressure in brackets).

The further compound preferably has an affinity with the metal or metaloxide layer, and with vapour deposited melamine crystals. A way of measuring the affinity is by measuring the surface tension of the fluid. In one embodiment, the surface tension is below 70 mN/m at 25° C. Generally, the surface tension will be about 10 or higher, preferably about 20 or higher. Preferably, the surface tension will be about 60 or lower, and more preferably about 40 or lower. Suitable examples include, but are not limited to methanol (22), acetic acid (27), butylacetate (25), ethanol (22), acetone (23) with the metal or metal oxide layer. (surface tension in brackets) The affinity with the triazine layer and with metal or metaloxide layer can be measured by measuring the surface tension of these layers. Preferably the surface tension of the liquid is close to the surface tension of the (vapor deposited) triazine layer.

Without being bound to theory, inventors think that due to the further compound which is in high concentration, or as a liquid at the surface of the metal or metal oxide layer, the crystallinity of the melamine can be affected. Therefore it can be useful to apply a second vapour deposited triazine layer with a high level of crystallinity to increase strength and barrier properties. A second layer preferably is applied in-line after depositing the first layer or may be applied off-line.

The further compound can be applied in a number of ways to the metal or metal oxide layer. In one embodiment, a liquid layer is applied via a slit in a dispensing apparatus, optionally levelled by a doctor blade or press roll. In another embodiment, a gaseous compound is applied on the surface of the metal or metal oxide, which surface is kept at a sufficient low temperature that the further compound condenses on the surface.

Preferably the temperature of the coating roll is kept below the boiling temperature of the liquid at ambient pressure.

In yet another embodiment, the metal or metal-oxide layer is treated with a silane coupling agent to increase the adhesion. The silane coupling agent may be dissolved in a liquid that is used as further compound.

In yet another embodiment, the metal or metal-oxide layer is treated with a urethane polymer or polyester to increase the adhesion. The urethane polymer or polyester may be dissolved in a liquid that is used as further compound, or can be applied off-line. Such urethane oligomer or polyester is less preferred, as it may be difficult to apply in line.

Preferably, the substrate is kept at a temperature of about 50° C. or lower.

Vapour-depositing as such is a process known to the skilled person. As is known, a vapour-depositing step is often carried out at a reduced pressure, i.e. a pressure below atmospheric pressure. In the process according to the invention, the pressure preferably is below about 1000 Pa, preferably below about 100 Pa even more preferably below about 1 Pa, more preferably below about $1 \times 10^{-2}$ Pa. It was found, surprisingly, that the properties of the composite material, such as the barrier properties, can be even further improved by reducing the pressure at which the vapour-depositing step is carried out even further, preferably to about $4 \times 10^{-3}$ Pa or below. More preferably, the vapour-depositing step is carried out at a pressure of about $2 \times 10^{-3}$ Pa or below or about $1 \times 10^{-3}$ Pa or below; in particular, the vapour-depositing step is carried out at a pressure of about $5 \times 10^{-4}$ Pa or below, or about $1 \times 10^{-4}$ Pa or below; more in particular, the vapour-depositing step is carried out at a pressure of about $5 \times 10^{-5}$ Pa or below, or about $1 \times 10^{-5}$ Pa or below; most preferably, the vapour-depositing step is carried out at a pressure of about $5 \times 10^{-6}$ Pa or even of about $1 \times 10^{-6}$ Pa or below.

During the vapour-depositing step, the temperature of the substrate is about −60° C. or higher, preferably about −30° C. or higher, and even more preferable about −20° C. or higher, and most preferable about −15° C. or higher. The temperature of the substrate generally will be about +125° C. or lower, preferably about +100° C. or lower, even more preferably about +80° C. or lower, and most preferably about 30° C. or lower. The temperature of the substrate is defined herein as the temperature of the part of the substrate that is not being vapour-deposited. For example, if the vapour-depositing step is done on a film which is guided over a temperature-controlled coating drum, the temperature of the substrate is the temperature at which the coating drum is controlled, thus the temperature of the surface section of the film that is in immediate contact with the coating drum. In such a case, and in view of the fact that the to be deposited compounds often have a much higher temperature than 125° C., it will typically occur—as is known—that the temperature of the side of the substrate that is being deposited is higher than the temperature of the side that is not being deposited.

Methods to ensure that the substrate has a defined temperature are, as such, known. One such a known method of ensuring that the substrate has a defined temperature is applicable in case there is at least one section, plane or side of the substrate where no layer is to be vapour-deposited; the said section, plane or side can then be brought into contact with a cooled or heated surface to bring the temperature to a desired level and keep it there. As an example, it is known that in case the substrate is a film and the vapour-depositing step is executed as a semi-continuous of continuous process whereby the layer will be deposited on one side of the film, the said film can be guided over a temperature-controlled roll, also known as coating drum, in such a fashion that the other side of the film—where no layer will be deposited—is in contact with the temperature-controlled roll before and/or during and/or following the vapour-depositing step.

The apparatus of the present invention is an apparatus for depositing a metal or metaloxide and a triazine under vacuum on a substrate, comprising winding rolls and at least one vacuum chamber with a metal or metaloxide deposition part and a triazine deposition part, the triazine deposition part comprising a triazine evaporator and an outlet for applying the further compound.

In another embodiment, the apparatus of the present invention is an apparatus for depositing a triazine under vacuum on a substrate having a metal or metaloxide layer, comprising winding rolls and at least one vacuum chamber with a triazine deposition part, the triazine deposition part comprising a triazine evaporator and an outlet for applying the further compound.

Preferably, the triazine deposition part comprises a cooling drum.

Preferably, the outlet for the further compound is directed to the film.

FIG. 1 is a schematic drawing of an apparatus in which the process of the present invention can be applied.

In the drawing, (1) is the substrate, for example a film, which is rolled from winding rolls or bobbin (2) onto bobbin (2'). The film preferably is plasma or corona treated, which treatment can have been performed beforehand, or which can be done in-line (not shown). The film is guided by rolls (3) and (3'). Vessel (4) is a representing a metal or metal oxide vaporiser. By sputtering the metal or metal oxide, the film will be heated, and preferably the film is cooled by cooling roll (6). Opposite of the vaporiser (4), a pressure roll can be present. A cooling roll could also preferably be placed more or less opposite to the outlet of the melamine evaporator. In that case, it could also act as a pressure roll. It is however equally possible to use a coated film, in that case the metal or metal-oxide sputtering vessel and cooling roll is not necessary, although a cooling roll preferably is used in any set-up. Vessel (5) represents the vaporisation vessel for the triazine compound, which triazine is applied onto the metal or metal oxide layer. Circle (7) depicts an outlet (7) to apply the further compound. It appeared to be preferred that the further compound was present on the surface of the metal. Evaporating the further compound in the triazine vaporisation vessel (5) was somewhat less effective, although it has worked if a larger amount of further compound was used. Equally, putting the outlet (7) upstream of the triazine vaporisation vessel appeared less effective. The outlet (7) as used in the examples was an evaporator from which further compound was evaporated, which compound was condensed onto the surface of the metal, alternatively, the gaseous concentration of the further compound was high during the crystallisation of the melamine. In case the opening was in the direction of the film, best results were obtained.

The apparatus of FIG. 1 was housed in a vacuum chamber (not shown), that could be brought to a vacuum of $1 \cdot 10 \cdot 10^{-5}$ Pa. It is also possible to use two vacuum chambers with a thin slit to allow the composite layer to move, one with the metal or metal oxide coating drum, and one with the triazine coating drum as this would allow different processing conditions in both compartments, and limits fouling.

The invention will be further elucidated by the following non-limiting examples.

EXAMPLES 1-9 AND COMPARATIVE EXPERIMENT 1-2

In an apparatus as shown in FIG. 1 coating experiments were performed. A biaxially oriented polypropylene film (BOPP) was coated with aluminium (avarage thickness 28 nm), and subsequently with melamine at a vacuum of 50 μPa. A further compound was evaporated near the aluminium surface as further explained in the table. The film speed was 9 or 5 m/sec. Some of the composite layers were further printed. All were laminated with a further plastic film in order to measure the lamination strength.

The lamination strength was measured according to JIS Z0238 with a Tensilon instron tester, at a speed: of 30 mm/min, the angle between the two films was 90 degree. As sealant (second film) LLDPE was used from Tohcello Co Ltd (TUX FCS), and as adhesive a reactive polyurethane in a solvent from Mitsui Takeda Chemicals (Takelac A-515 and Takenate A50, which are mixed just before use).

The Oxygen transmission rate (OTR) was measured with OXTRAN 2/20 manufactured by Modern Control Cop. In an atmosphere of 30° C. and 70% RH.

Vapor permeability was measured with a PERMATRAN 3/31 manufactured by Modern Control Co, I an atmosphere of 40° C. and 90% RH.

| Example | Further compound | Flow (L/min); Pipe position* | Lamination strength N/inch | OTR** of composite layer |
|---|---|---|---|---|
| Comp Exp 1 | None | — | 1.0 | Not determined |
| Comp Exp 2 | [plasma treatment] | | 1.0 | Not determined |
| 1 (5 m/s) | Butyraldehyde | 700; C | 2.5 | 29 |
| 2 (9 m/s) | Propanal | 500; C | 3.5 | 24 |
| 3 (5 m/s) | Propanal | 100; C | 2.0 | 9.6 |
| 4 (5 m/s) | Propanal | 100; B-F1 | 2.5 | 43 |
| 5 (5 m/s) | Acetone | 500; B-F3 | 3.0 | 16.6 |
| 6 (9 m/s) | Acetone | 500; B-F2 | 3.0 | 22.2 |
| 7 (9 m/s) | Methanol | 500; B F1 | 5.0 | 15.9 |
| 8 (9 m/s) | Methanol | 200; B F1 | 4.0 | 15.4 |
| 9 (9 m/s) | Methanol | 50; B-F1 | 4.0 | 16.9 |

*The position of the evaporator for the polar compound was as follows:
C further compound evaporator in the melamine evaporator
B further compound evaporator before the melamine evaporator
F1 opening in the direction of the film
F2 opening in the direction of the melamine evaporator
F3 opening parallel to the film
**OTR in cc/m$^2$ · 24 h · MPa

EXAMPLE 10

In an analogous way, a Polyetheleneterephthalate film of 12 micron (PET) was treated with Aluminum oxide (15 nm) and melamine (300 nm), while methanol was supplied to the oxide layer. The OTR was 5, the WVTR 0.6. Next, the melamine layer was printed, causing a slight increase in transmission rates. Without protective layer, the OTR generally triples in value. Part of the printed composite layer was further laminated with an adhesive as described for example 1-9, and a propylene film. Another part was laminated with a polyethylenefilm in a direct extrusion process (the temperature of the die was 320° C.). The crystalline melamine layer could withstand the heating by the films so made (15-35 micron thick PE film) and showed good lamination strength.

EXAMPLE 11

In an analogues way laminates were made with a composite layer made as described in Example 7. In the further lamination, an adhesive was applied on the melamine layer, consisting of Novacote NC 275A and catalytic agent CA 12 (42.7 and 10.7 wt % respectively) and 46.6% ethyl acetate. The adhesive had a percentage of solid of 40%. The OTR after lamination was 9.5. The lamination strength>2 N/inch.

The invention claimed is:

1. A laminate comprising a substrate-layer, a plastic film, and a crystalline triazine layer and a metal or metal oxide layer between the substrate-layer and the plastic film, wherein the laminate has a lamination strength of about 2 N/25 mm (inch) or more as measured in a 90 degree tensile testing at 30 mm/min.

2. The laminate according to claim 1, wherein the metal or metal oxide layer is directly bonded to the substrate-layer or to the plastic film.

3. The laminate according to claim 1, wherein the crystalline triazine layer is bonded to the metal or metal oxide layer.

4. The laminate according to claim 1, wherein the laminate comprises an adhesive layer between the crystalline triazine layer and at least one of the substrate-layer and the plastic film.

5. A composite layer comprising a substrate, a metal or metal oxide barrier layer and a crystalline triazine layer comprising a triazine compound, wherein the composite layer, when laminated on the crystalline triazine layer with an adhesive and a plastic film, exhibits a lamination strength of about 2 N/25 mm (inch) or more as measured in 90 degree tensile testing at 30 mm/min.

6. The laminate according to claim 1, which further comprises a printed pattern.

7. The laminate according to claim 1, wherein the laminate exhibits an oxygen transmission rate (OTR) as measured in an atmosphere of 30° C. and 70% RH, of about 20 ml/m$^2$·24 h·MPa or less for laminates comprising biaxially oriented polypropylene (BOPP) as the substrate-layer, or about 5 ml/m$^2$·24 h·MPa for laminates comprising polyethylene terephthalate (PET) as the substrate-layer.

8. The laminate according to claim 1, wherein the laminate exhibits a water vapor permeability (WVTR) measured in an atmosphere of 40° C. and 90% RH is 2 g/m$^2$·24 h or less for laminates comprising biaxially oriented polypropylene (BOPP) as the substrate layer, or about 5 g/m$^2$·24 h or less for laminates comprising polyethylene terephthalate (PET) as the substrate-layer.

9. The laminate according to claim 1, wherein the lamination strength is at least 2.5 N/inch.

10. The laminate according to claim 9, wherein the lamination strength is at least 3 N/inch.

11. The laminate according to claim 1, wherein the triazine layer comprises melamine.

12. The laminate according to claim 1, wherein the metal or metal oxide layer is a layer selected from the group consisting of aluminium, aluminium oxide, magnesium oxide and silicium oxide.

13. The laminate according to claim 1, wherein the substrate-layer is plastic or paper.

14. The laminate according to claim 13, wherein the substrate-layer is a plastic film.

15. The laminate according to claim 14, wherein the substrate-layer is a biaxially oriented polypropylene (BOPP) or a polyethylene terephthalate (PET).

16. The laminate or composite layer according to claim 1, which comprises a pattern or FIGURE present on the crystalline triazine layer.

17. A flexible or rigid packaging which comprises a laminate according to claim 1.

18. A flexible display which comprises a laminate according to claim 1.

* * * * *